United States Patent [19]

Eguchi et al.

[11] Patent Number: 5,432,379
[45] Date of Patent: Jul. 11, 1995

[54] MIM-TYPE ELECTRIC DEVICE PRODUCTION THEREOF, AND ELECTRONIC APPARATUS EMPLOYING THE DEVICE

[75] Inventors: Ken Eguchi; Haruki Kawada, both of Yokohama; Tsutomu Ikeda, Hachioji; Kiyoshi Takimoto, Isehara; Toshihiko Takeda, Atsugi, all of Japan

[73] Assignee: Canon Kabushiki Kaisha, Tokyo, Japan

[21] Appl. No.: 305,284

[22] Filed: Sep. 14, 1994

Related U.S. Application Data

[63] Continuation of Ser. No. 953,849, Sep. 30, 1992, abandoned.

[30] Foreign Application Priority Data

Oct. 1, 1991 [JP] Japan .................. 3-278890
Aug. 25, 1992 [JP] Japan .................. 4-247200

[51] Int. Cl.⁶ .................. H01L 23/48; H01L 29/40
[52] U.S. Cl. .................. 257/627; 257/741; 257/759
[58] Field of Search .............. 257/627, 628, 741, 759, 257/762, 763, 764, 768, 769

[56] References Cited

U.S. PATENT DOCUMENTS

| | | | |
|---|---|---|---|
| 5,020,881 | 6/1991 | Matsuda et al. | 350/333 |
| 5,075,738 | 12/1991 | Matsuda et al. | 357/6 |
| 5,140,398 | 8/1992 | Matsuda et al. | 357/30 |
| 5,170,238 | 12/1992 | Sakai et al. | 307/311 |

FOREIGN PATENT DOCUMENTS

| | | | |
|---|---|---|---|
| 63-96956 | 4/1988 | Japan | H01L 29/28 |
| 63-161552 | 7/1988 | Japan | G11B 9/00 |
| 63-161553 | 7/1988 | Japan | G11B 9/00 |

OTHER PUBLICATIONS

Thin Solid Films, vol. 99, No. 1/2/3, 14th Jan., 1983, pp. 277–282, G. L. Larkins Jr., et al., "Langmuir-Blodgett Films As Barrier Layers In Josephson Tunnel Junctions."

Electronic Letters, vol. 20, No. 12, 7th Jun., 1984, pp. 489–491, J. Batey, et al., "GaP/Phthalocyannine Langmuir-Blodgett Film Electroluminescent Diode."

Electronic Letters, vol. 20, No. 20, 27th Sep., 1984, pp. 838–839, N. J. Thomas, et al., "GaAs/LB Film Miss Switching Device."

*Primary Examiner*—Sara W. Crane
*Attorney, Agent, or Firm*—Fitzpatrick, Cella, Harper & Scinto

[57] ABSTRACT

An MIM type electric element has an upper electrode, a lower electrode, and a barrier layer held therebetween and composed of an insulator or a semiconductor. The lower electrode contains a noble metal crystal having a facet of a plate-shaped crystal formed on a substrate. The facet has a plane given by the crystal face (111) and contains a region having a plane orientation variance angle of not more than 1° by X-ray diffraction.

26 Claims, 8 Drawing Sheets

TUBE : Cu
TUBE VOLTAGE : 30 kV
TUBE CURRENT : 20 mA
SAMPLING WIDTH : 0.020°
SCANNING RATE : 2.000°/min
DIVERGING/SCATTERING SLIT : 1°/1°
LIGHT-RECEIVING SLIT : 0.30 mm

VARIANCE ANGLE : 0.924°

MIM-TYPE ELECTRIC DEVICE PRODUCTION THEREOF, AND ELECTRONIC APPARATUS EMPLOYING THE DEVICE

This application is a continuation of application Ser. No. 07/953,849, filed Sep. 30, 1992, now abandoned.

BACKGROUND OF THE INVENTION

1. Field of the Invention

The present invention relates to an MIM (Metal-Insulator-Metal) type of electric device which has a sandwich structure comprising a pair of opposing electrodes and an insulating or semiconductive medium held between the electrodes, and exhibits various electric characteristics on application of voltage to the electrodes. The present invention also relates to a process for producing the electric device, and an electronic apparatus employing the device, such as an image-displaying apparatus, an image-drawing apparatus, and an information-transferring apparatus.

2. Related Background Art

In recent years, orderly structures of organic materials have come to attract attention in connection with development and improvement of electronic functions, and molecular electronic devices employing organic molecules have come to be noticed. Consequently, Langmuir-Blodgett films (LB films) are investigated comprehensively which are considered to be one of the techniques of constructing molecular electronic devices.

The Langmuir-Blodgett film is prepared by laminating sequentially monomolecular layers of an organic compound regularly, and the thickness thereof is controllable by a molecular length. A uniform and homogeneous ultra-thin film can be formed with the Langmuir-Blodgett film. Therefore, many attempts have been made to use the Langmuir-Blodgett film for an insulator. The examples are: a tunnel junction elements of a metal/insulator/metal (MIM) structure [G. L. Larkins et al.: Thin Solid Films, vol. 99 (1983)], a luminescent element having a metal/insulator/semiconductor (MIS) structure [G. G. Roberts, et al.: Electronics Letters, vol.20, p.489 (1984)], and a switching element [N. J. Thomas et al.: Electronics Letters, vol.20, p.838 (1984)].

Heretofore, the above mentioned investigations have been conducted by using LB films of fatty acids which are relatively easy to handle. Recently, organic materials which exhibit improved heat resistance and in mechanical strength have been successfully developed. Actually, the inventors of the present invention prepared an element in a sandwich structure having an LB film of such a material held between an electroconductive material like a metal (generally called an MIM structure and an MIM type element from its construction), and observed and measured the characteristics including physical properties and electrical properties of the insulation film, thus finding a novel switching memory phenomenon (Japanese Patent Application Laid-Open No. Sho-63-96956).

Insulating films formed by the LB method can be formed by laminating monomolecular films in the same shape as the surface of the lower electrode, and therefore does not involve the problem of nonuniformity in thickness The lower electrode of an MIM type device has been formed hitherto by vacuum vapor deposition or sputtering. However, the metal thin film formed by such a method is polycrystalline, and inevitably shows large distribution of orientation axis of the crystal face, and the crystal plane is not simple, having many edges formed by different crystal face.

If such a device is subjected to the action of a strong electric field, the electric field tends to concentrate highly at the aforementioned edge portions, which lowers the stability and reproducibility of the device. For example, an electrode metal may migrate into an insulating layer significantly at such an edge portion. During long time of driving of the device, the device may frequently be damaged at the edge portion by dielectric breakdown or the like to considerably shorten the life of the device.

SUMMARY OF THE INVENTION

An object of the present invention is to provide a novel MIM type electric device which does not have the above disadvantages, and is less liable to be damaged by dielectric breakdown while running in a strong electric field or for a long time, thereby achieving satisfactory device life.

Another object of the present invention is to provide a process for producing the above MIM type electric device.

A further object of the present invention is to provide an image-displaying apparatus and an image-drawing apparatus which gives an image or draws an image pattern with high resolution, high luminance, and low luminance irregularity.

A still another object of the present invention is to provide an information-transferring apparatus which is capable of storing information virtually permanently after the power source voltage is turned off.

According to one aspect of the present invention, there is provided an MIM type electric device having an upper electrode, a lower electrode, and a barrier layer held therebetween and composed of an insulator or a semiconductor, the lower electrode containing a noble metal crystal having a facet of a plate-shaped crystal and being formed on a substrate, the facet having a plane given by the crystal face (111) and containing a region having a plane orientation variance angle of not more than 1° by X-ray diffraction.

According to another aspect of the present invention, there is provided a process for producing an MIM type electric device having an upper electrode, a lower electrode, and a barrier layer held therebetween and composed of an insulator or a semiconductor, comprising steps of preparing a complex solution formed by dissolving a metal for the lower electrode in a solution capable of dissolving the metal, decreasing solubility of the metal in the complex solution to deposit a crystal of the metal from the complex solution on a substrate, forming a barrier layer on the crystal of the metal, and forming an upper electrode on the barrier layer.

According to still another aspect of the present invention, there is provided an information-transferring apparatus, comprising a circuit having an above-mentioned MIM type electric device and a photoconductive device connected in series to the electric device, and a means for applying voltage to the circuit.

According to a further aspect of the present invention, there is provided an information-transferring apparatus, comprising a circuit formed from diode devices connected in series in the same rectification direction, an above-mentioned MIM type electric device connected to a connection point of the diode devices, a photoconductive device placed at one end of the circuit, and a resistor at the other end of the circuit; and a means for applying voltage to the circuit.

According to a still further aspect of the present invention, there is provided an image-displaying apparatus, comprising a plurality of MIM type electric devices having a portion to emit an electron beam, modulation electrodes opposing thereto, and an image-forming member; the MIM type electric devices having an upper electrode, a lower electrode, and a barrier layer held therebetween and composed of an insulator or a semiconductor, the lower electrode containing a noble metal crystal having a facet of a plate-shaped crystal and being formed on a substrate, the facet having a plane given by the crystal face (111) and containing a region having a plane orientation variance angle of not more than 1° by X-ray diffraction; the modulation electrodes modulating the electron beam emitted from the electric devices; and the image-forming member forming an image by projection of the modulated electron beams.

According to a still further aspect of the present invention, there is provided an image-drawing apparatus, comprising an MIM type electric device having a portion to emit an electron beam, a means for focusing the electron beam emitted from the electric device to a desired position, and a means for deflecting the electron beam; the MIM type electric device having an upper electrode, a lower electrode, and a barrier layer held therebetween and composed of an insulator or a semiconductor, the lower electrode containing a noble metal crystal having a facet of a plate-shaped crystal and being formed on a substrate, the facet having a plane given by crystal face (111) and containing a region having a plane orientation variance angle of not more than 1° by X-ray diffraction.

DESCRIPTION OF THE PREFERRED EMBODIMENT

The present invention decreases defects in electrode surface, which are ascribable to surface edges, by decreasing plane orientation variance on the electrode surface and uniformizing the crystal plane on the surface. On the surface having a plane orientation variance angle of not more than 1° according to the present invention, monocrystallinity is high, and owing to uniform crystal plane on the surface, the device characteristics are improved and stabilized. In particular, a device having an extremely thin insulating layer is improved and stabilized in device characteristics, compared with a device having an electrode with similar surface smoothness.

The present invention also enables stabilization of electric characteristics of the device under strong electric field.

The present invention is described below by reference to drawings.

Figure 1:
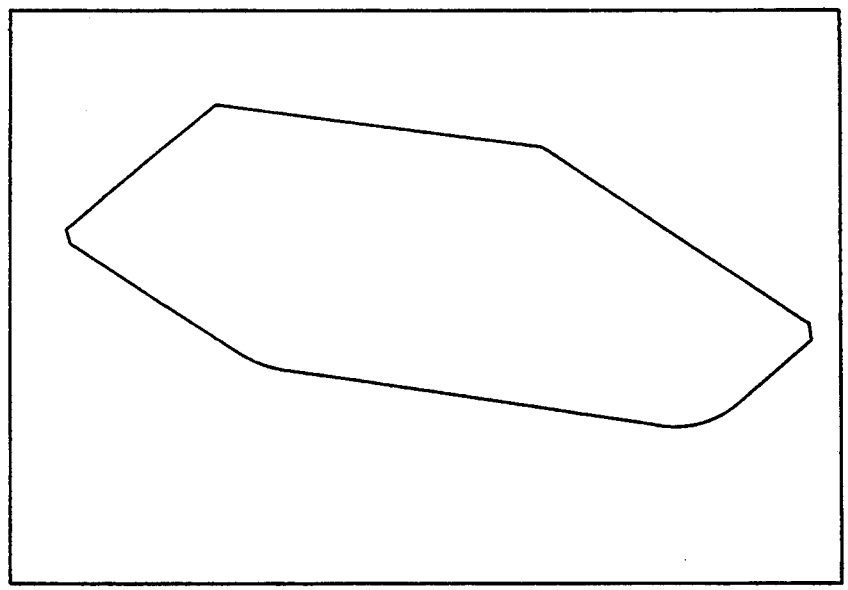
FIG. 1 shows schematically an optical microscopic image of an electrode comprising a plate-shaped gold crystal formed on a silicon substrate according to the present invention.
Figure 2:
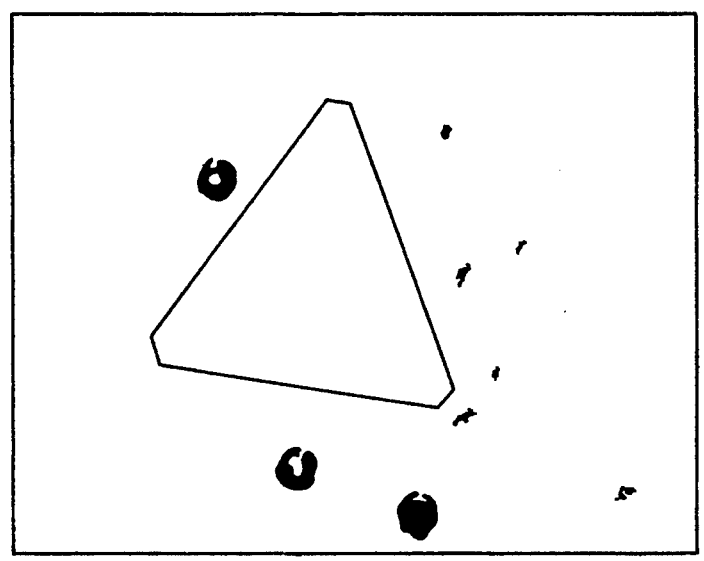
FIG. 2 shows another optical microscopic image of an electrode comprising a plate-shaped gold crystal formed on a silicon substrate according to the present invention.

FIG. 1 shows schematically an optical microscope image of a plate-shaped gold crystal formed on an Si crystal substrate according to the present invention. The gold crystal in FIG. 1 is planar and nearly regular hexagonal. Generally, the crystal obtained has a trigonal symmetry axis (FIG. 2). Asymmetric crystal deformed from the shape of FIG. 2 is also observed. However, many of the gold crystals have facet faces formed clearly corresponding to respective crystal faces. The planar faces of the gold crystals are observed to be oriented in a [111] axis with little defects by measurement of electro-channeling pattern by SEM.

Figure 3:
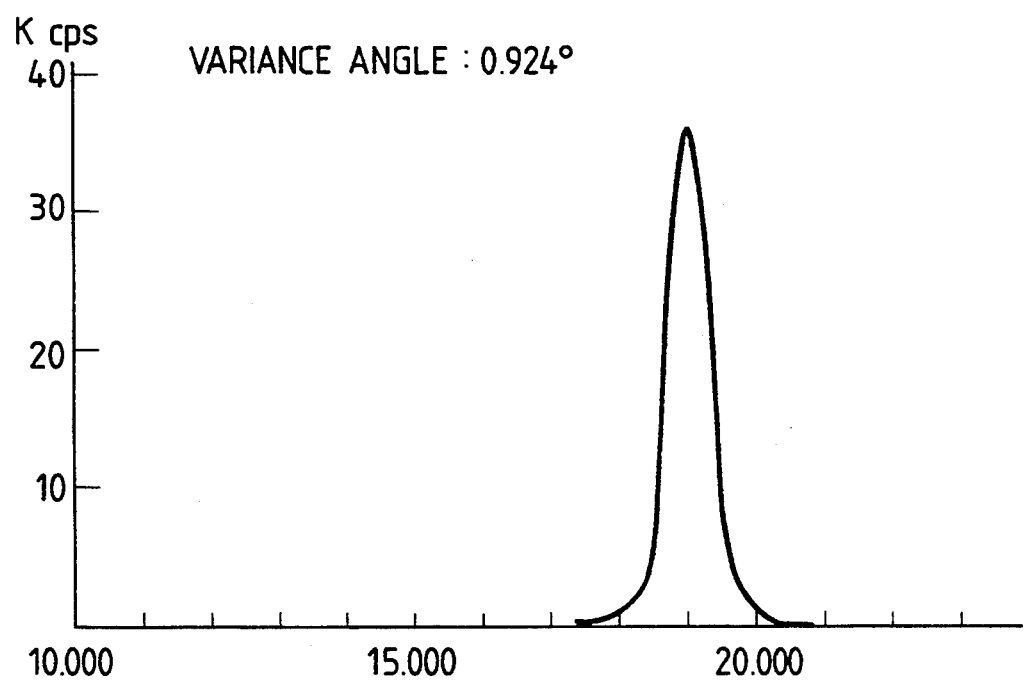
FIG. 3 shows a small angle X-ray reflection-diffraction spectrum of an electrode of the present invention.
Figure 13:
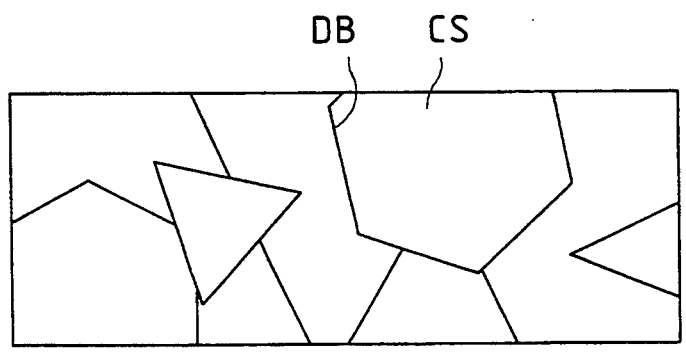
FIG. 13 shows a surface state of an essential portion of an electrode prepared in a working example of the present invention.

On the surface of crystalline gold electrode constructed of such plate-shaped crystals, the variance angle of orientation of (111) crystal face is not more than 0.9°, and the electrode is highly oriented according to X-ray diffraction data (measured by an X-ray diffraction apparatus RAD3B, made by Rigaku Denki K. K.) shown in FIG. 3. Under a more suitable condition, an electrode can be prepared which has a variance angle of not more than 0.6°. Highly oriented polycrystalline gold electrode is also obtained on a variety of substrate material. The domain boundaries DB of the crystals have flat faces CS formed nearly linearly (FIG. 13) with a variance angle of [111] axis of not more than 1°. Further, the ratio of the maximum diameter of (111) crystal face to the height of the plate-shaped gold crystal is about 30, generally the ratio of 10 or more can be prepared readily, and under favorable conditions the ratio can be 100 or higher.

The plate-shaped gold crystal may be formed by (1) dissolving gold in an oxidative solution capable of dissolving gold such as a solution of $I_2$ in an aqueous KI solution to prepare an aqueous gold complex solution in which gold is dissolved mainly in a form of $[AuI_4]^-$, (2) immersing a substrate in the solution, (3) removing $I_2$ from the reaction system to reduce solubility of gold, namely evaporation of $I_2$ by heating or reduction of $I_2$ to $I^-$ by using a reducing agent, and further (4) decomposing by e.g. heating the gold complex to deposit gold on the substrate. If the deposition rate is high, granular or lump polycrystalline matter is formed. Therefore, the plate-shaped gold crystal grows on a balance of the oxidative etching rate of deposited crystal by $I_3^-$ and the decomposition rate of the complex. This is analogous to gas-phase epitaxial growth.

Figure 4:
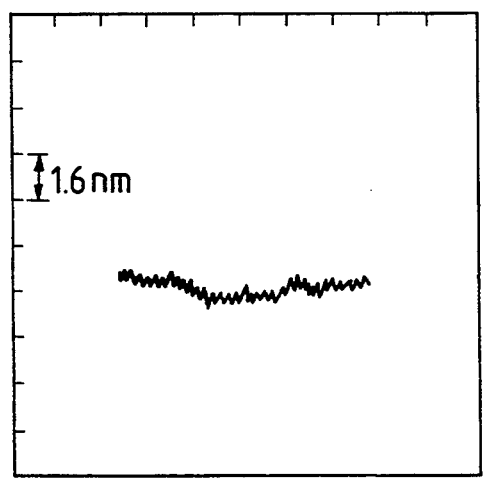
FIG. 4 shows a topographic profile in the Z axis direction of a surface of the electrode of the present invention.

The surface irregularity of the (111) crystal face having grown in such a manner is not more than 1 nm in the z axis direction of atomic steps with a long period shown as topograplic profile observed by an STM image in FIG. 4. A smoother electrode can be obtained by preparation of a plate-shaped gold electrode, in which difference between the deepest valley and the highest peak (maximum surface roughness) in a region surrounded by a square with sides of 10 μm length is not more than 1 nm and the peak values (dispersion peak) of the irregularity dispersion around the average level of surface is not more than 0.5 nm.

The size of the plate-shaped gold crystal is usually in the range of from 1 μm to 1 mm, and under optimum conditions, up to 10 mm. Thus crystals can be obtained in a size of several mm square. In some cases, crystal of not less than 10 mm in size can be obtained although the control of the conditions is somewhat difficult. On the other hand, an electrode may be prepared by forming continuously fine plate-shaped crystals. Such an electrode has also the variance angle of the (111) axis smaller than that of the electrode prepared by usual vacuum deposition, and is highly oriented.

In this process for production, the substrate may be of any material unless the material is seriously corroded by the gold complex solution. The material includes insulating materials such as mica, MgO, $SiO_2$, and $Si_3N_4$, organic polymer materials, and electroconductive materials such as Si (crystalline and amorphous), graphite (HOPG), various metal, and metal compound.

The easy deposition of gold has been found to depend on the kind of the substrate. Therefore, the plate-shaped gold crystal can be deposited and grown selectively at a desired site by utilizing such difference in gold deposition characteristics of the substrate.

The characteristics and the production of the plate-shaped crystal are described above by reference to gold as the material. The growth of the plate-shaped crystal is not limited to gold, but analogous technique is applicable to other noble metal materials, like Pt, Pd, Rh, and Ir, capable of forming halogenated complex, and further cyano complexes and sulfite complexes.

Figure 5A:
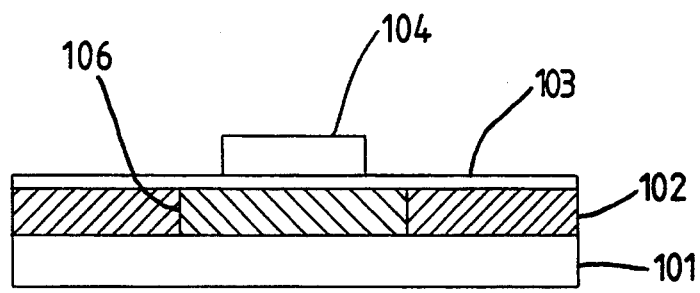
FIGS. 5A and 5B show schematicaly cross-sectional views of an MIM type electric device of the present invention.
Figure 5B:
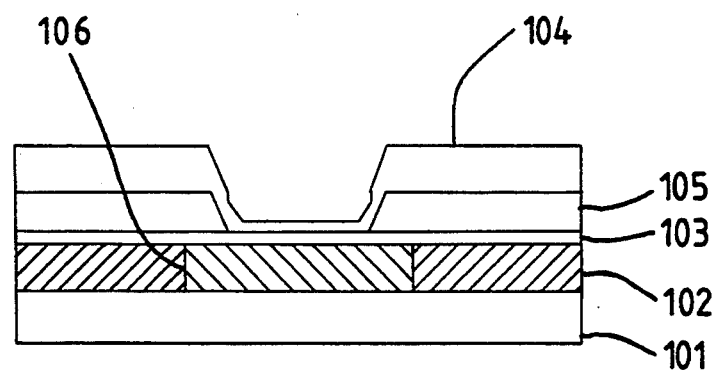

FIG. 5A and FIG. 5B show sectional views of MIM type electric device employing electrode substrate of the present invention. The device has a substrate 101, a lower electrode 102 having smooth face and domain boundaries 106, an insulator layer 103, and an upper electrode 104.

Figure 6:
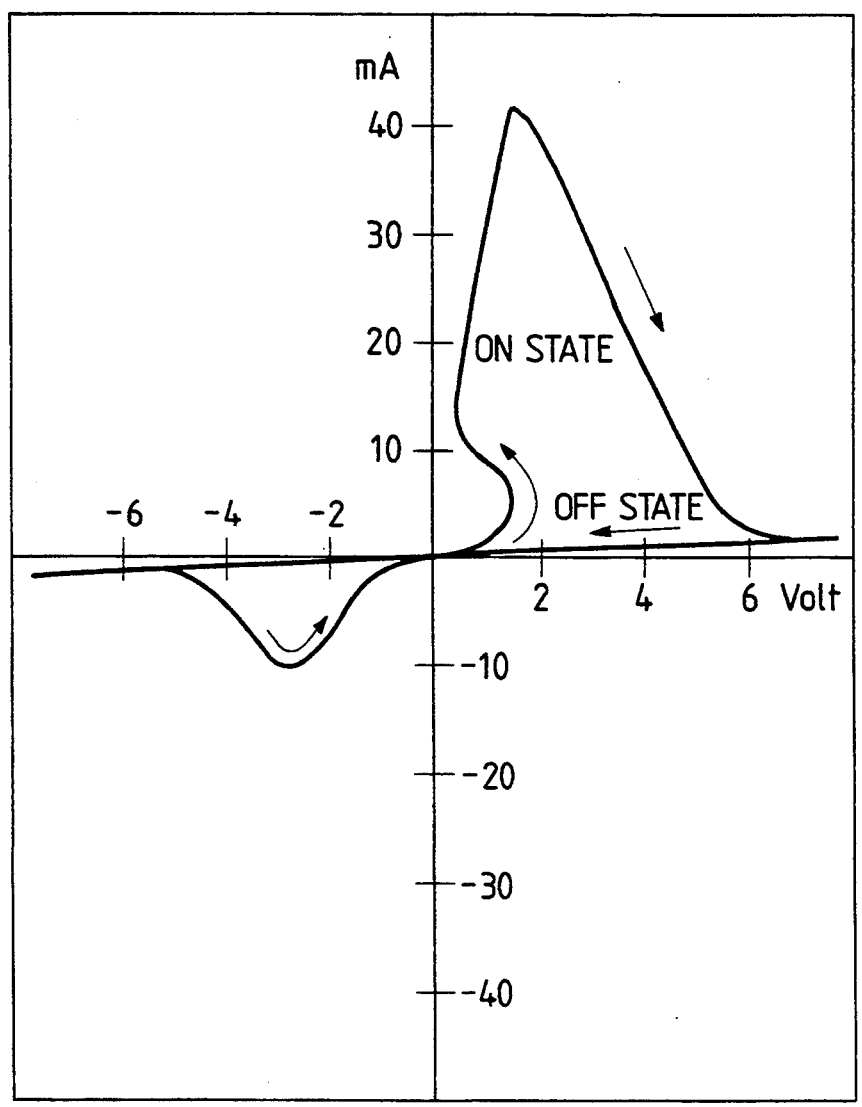
FIG. 6 is a graph showing a current-voltage switching characteristic of an MIM type electric device of the present invention.

The useful insulator includes those exhibiting a memory-switching phenomenon (electric memory effect) in current-voltage characteristics as disclosed in Japanese Patent Application Laid-Open Nos. Sho-63-161552 and Sho-63-161553, such as monomolecular or monomolecular built-up films of organic compounds having both a group having a π electron level and a group having σ electron levels only and deposited on an electrode. By the switching-memory effect, the device having an organic monomolecular or monomolecular built-up film between a pair of electrodes changes its state (or is switched) reversibly between a low-resistance state (ON state) and a high-resistance state (OFF state) on application of a voltage exceeding a threshold value for the change of the state. Each state can be retained (or memorized) without application of a voltage (FIG. 6).

Since most of organic materials are insulative or semi-insulative, the organic materials having a group having a π electron level applicable in the present invention include a great number of materials. Examples of compounds having a π electron system applicable to the present invention include dyes having porphyrin skeleton such as phthalocyanine and tetraphenylporphyrin; azulene dyes having a squarilium group or a croconic methine group as a linking chain; cyanine-analogous dyes in which two nitrogen-containing heterocycles such as quinoline, benzothiazole, and benzoxazole are linked by a squarilium group or a croconic methine group; cyanine dyes; condensed polycyclic aromatic compounds such as anthracene and pyrene; linear polymers of aromatic compounds or heterocyclic compounds; diacetylene polymers; derivatives of tetracyanoquinodimethane or tetrathiafluvalene and analogues and charge transfer complexes thereof; and metal complex compounds such as ferrocene, and tris(bipyridine)ruthenium complex. The high polymer compounds preferred in the present invention include condensation polymer such as polyimides, and biopolymers such as bacteriorhodopsin and protein.

The aforementioned insulator layer 103 may be formed suitably by an LB process from among known techniques in view of controllability, ease, and reproductability, although the layer can be formed by vapor deposition or a cluster-ion beam method. According to the LB process, a monomolecular, or monomolecular built-up film of an organic compound having both a hydrophobic group and a hydrophilic group in a molecule can readily be formed, on a substrate, as an organic ultra-thin film having a thickness of molecular order and being uniform and homogeneous over a large area. The insulator layer prepared by the LB process reflects the surface state of the underlying electrode substrate.

Incidentally, the LB process is a method for forming a monomolecular, or monomolecular built-up film of molecules having a hydrophilic moiety and a hydrophobic moiety in the molecule in good balance by utilizing the phenomenon that the molecules make monomolecular film on a water surface with the hydrophilic group directing downward.

The group constituting the hydrophobic moiety includes a variety of hydrophobic groups such as saturated and unsaturated hydrocarbon groups, condensed polycyclic aromatic groups, linear polycyclic phenyl groups, and the like. These groups constitute the hydrophobic moiety singly or in combination thereof.

The group constituting the hydrophilic moiety includes typically hydrophilic groups such as a carboxyl group, an ester group, an acid amido group, an imido group, a hydroxyl group, and an amino group (primary, secondary, tertiary, and quaternary). These groups constitute the hydrophilic moiety singly or in combination thereof.

Such organic compounds, which have a hydrophilic group and a hydrophobic group in good balance and having an appropriate size of the molecule, are capable of forming monomolecular film on a surface of water, and are suitable materials in the present invention. From among the compounds mentioned above, polymeric compounds and large cyclic compounds such as phthalocyanine are preferred in view of heat resistance. In particular, use of a polymeric material such as a polyimide gives excellent heat resistance and film thickness of as small as about 4 Å per layer.

These compounds having a $\pi$ electron level are observed to exhibit switching memory effect at a film thickness of several tens of nanometers or less. The thickness of the film is preferably in the range of from 10 to 1000 Å in view of film formation and film uniformity. In the switching process, a voltage of several to 10 V is applied to the device, thereby the the electric field strength being as much as from $10^5$ V/cm to $10^6$ V/cm or more.

The material of the upper electrode 104 may be the same as or different from that of the aforementioned lower electrode 102. The switching device of the present invention may have such a structure that a second insulating layer 105 different from the above organic insulator is formed to limit the electroconductive region between the upper and lower electrodes (FIG. 5B). The material for the second insulator layer 105 includes organic resists, inorganic insulators, $SiO_2$, $Si_3N_4$, $Al_2O_3$, and the like. The thickness of the second insulator layer is preferably in the range of from 1000 Å to 5000 Å. The layer may be formed satisfactorily by any known thin-film-forming technique.

General feature of the present invention is described above regarding improvement of a switching device as an example. The MIM type electric device has a pair of electrodes, and an insulator layer composed of an insulator or a semiconductor and held between the electrodes. This MIM type electric device in a sandwich structure exhibits a variety of electric characteristics on application of voltage to the electrodes. Improvement of the characteristics of such devices used under application of strong electric field is an important technical problem.

The inventors of the present invention investigated comprehensively the improvement of the MIM type electric device in sandwich structure by preparing experimentally various MIM devices by use of the aforementioned noble metal crystal electrode substrates.

The characteristics of the MIM type electric device of the present invention is described in more detail by reference to Examples without limiting the invention in any way.

Example 1

In 50 ml of water, 4 g of potassium iodide (KI) and 0.6 g of iodine ($I_2$) were dissolved. Therein, a thin gold film of 5000 Å thick (about 0.08 g in weight) formed by vapor deposition was dissolved completely to prepare a gold-iodine complex stock solution. 10 ml of the stock solution was taken out and diluted with 50 ml of pure water to prepare a reaction mother liquor. A silicon substrate having a thermal oxidation film (1000 Å) was immersed in the mother liquor, and was heated on a hot plate at 80° C. As iodine vaporized, the solution turned clear and pale yellow, and plate-shaped gold crystals deposited. The plate-shaped crystals were found to be distributed uniformly over the entire surface of the substrate by optical microscopy observation. The variance angle of [111] axis of the electrode was found to be 0.6°. The surface of the plate-shaped crystal was observed to have maximum surface roughness of 0.8 nm and dispersion peak of 0.4 nm in a region surrounded by a square with sides of 10 $\mu$m length according to STM observation.

Subsequently, on the plate-shaped gold crystal electrode, there was formed an $SiO_2$ film in a thickness of 1500 Å by argon sputtering. The $SiO_2$ was etched by HF by using AZ1370 (made by Hoechst Co.) as the resist to form a current-passing region of 1000 $\mu$m square to allow electric current to flow between the upper electrode and the lower electrode.

On the resulting flat electrode substrate, an LB film of squarilium-bis-6-octylazulene (SOAZ) was formed as the insulator layer 103. The procedure of formation of the SOAZ-LB film as the insulator layer 103 is described below.

A solution of SOAZ (0.2 mg/ml) in chloroform was developed on an aqueous phase consisting of pure water at 20° C. to form a monomolecular film on the surface of water. After evaporation of the solvent, the surface pressure was raised to 20 mN/m. With the surface pressure kept constant, the aforementioned substrate electrode was slowly immersed into the water in a direction crossing the water surface at a rate of 10 mm/min, and then pulled out slowly at a rate of 5 mm/min to form a two-layered Y-type monomolecular built-up film. This procedure was repeated to form seven monomolecular built-up films of 2, 4, 8, 12, 20, 30, and 40 layers respectively on a substrate electrode.

Subsequently, an aluminum electrode was formed as the upper electrode 104 in stripes in a thickness of 1500 Å on the above-mentioned LB film so as to cover the current-passing region.

The current-voltage characteristics of the samples prepared above were measured by applying voltage between the upper electrode and the lower electrode. As to the results, the same memory-switching characteristics were obtained as disclosed in the disclosure of Japanese Patent Application Laid-Open No. Sho-63-96956 (FIG. 6). Such a device is capable of retaining either an ON state of low resistance or an OFF state of high resistance without application of voltage. The memory could be retained satisfactorily. The ratio of the resistances in the two states was in the order of six ciphers or higher.

The transition between the ON state and the OFF state was caused repeatedly for over a long time by application of A. C. voltage. Consequently, the ON/OFF transition of this device was stabilized in comparison with devices of the prior art. In particular, the effect was remarkable and the switching characteristics was stable even with the device having two layers of SOAZ which was instable according to prior art. Further, device damage, which is considered to be caused by local concentration of the electric field, occurred to a much lesser degree, and the life of the device was significantly improved.

Example 2

Switching devices having current-passing regions of from 1000 $\mu$m square to 10 $\mu$m square were prepared and tested in the same manner as in Example 1 except that a polyimide LB film was employed in place of the SOAZ-LB film of Example 1, and the thickness of the aluminum electrode was 2000 Å. Consequently, the same memory-switching characteristics were observed as in Example 1, and the resistance ratio of ON/OFF was in the order of about six ciphers.

The transition between the ON state and the OFF state was caused repeatedly for a long time by application of alternate voltage. Consequently, the ON/OFF transition of this device was stabilized in comparison with devices of the prior art. In particular, the switching characteristics was stable even with the device hav- 1 mmHg) for 30 minutes to convert the octadecylamine salt of the polyamido-acid as shown by formula (3), thus 4-layered polyimide monomolecular built-up film was obtained.

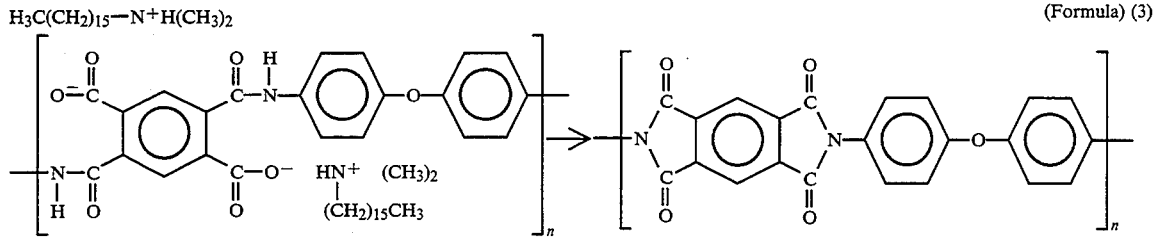

(Formula) (3)

ing an LB film of four or eight layers, which was instable according to prior art.

Further, even the sample having two layers, which does not exhibit switching characteristics according to prior art, exhibited the switching characteristics. Furthermore, device damage, which is considered to be caused by local concentration of the electric field, occurred to a much lesser degree, and the life of the device was significantly improved.

The procedure of forming the polyimide LB film is described below.

The polyamido-acid represented by the formula (1) below was dissolved in a mixed solvent of N,N'-dimethylacetamide-benzene (1:1 by volume) at a concentration of $1 \times 10^{-3}$M in terms of the monomer. This solution was mixed with a separately prepared $1 \times 10^{-3}$M solution of N,N'-dimethyloctadecylamine in the same solvent in a volume ratio of 1:2 (V/V) to prepare a solution of the amine salt of the polyamido-acid represented by the formula (2).

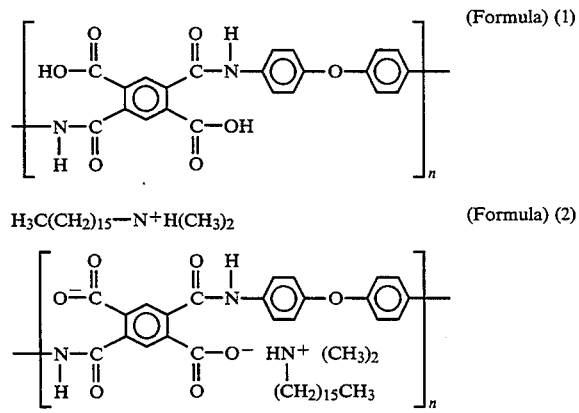

(Formula) (1)

(Formula) (2)

This solution was developed on an aqueous phase consisting of pure water at 20° C. to form a monomolecular film on the surface of water. After evaporation of the solvent, the surface pressure was raised to 25 mN/m. With the surface pressure kept constant, the aforementioned substrate electrode was slowly immersed into water in a direction crossing the water surface at a rate of 5 mm/min, and then pulled out slowly at a rate of 5 mm/min to form a two-layered Y-type monomolecular built-up film. This procedure was repeated to form nine monomolecular built-up films of 2, 4, 8, 12, 18, 24, 30, 42, and 60 layers of the octadecyl amine salt of the polyamido-acid respectively on a substrate electrode. Subsequently, the substrate was heated and baked at 200° C. at a reduced pressure (about

Example 3

MIM type electron-emitting devices having a sandwich structure were prepared in the same manner as in Example 2, except that 6 kinds of the polyimide LB built-up films of 12, 18, 24, 30, 36, and 40 layers were provided, and the thickness of the aluminum upper electrode was 150 Å at the current-passing region and 2000 Å elsewhere (FIG. 5B).

The resulting devices were tested for electron emission in a vacuum of $2 \times 10^{-6}$ Torr or a higher vacuum and by application of voltage between the upper electrode and the lower electrode. The electron emission efficiency was about $1.5 \times 10^{-2}$ at the highest. With larger number of built-up layers of the insulator layer, higher voltage was required to obtain the same emission current. The electron emission pattern was observed by use of a fluorescent screen placed directly above the device. The fluorescence pattern coincided with the shape of the surface electrode, and the uniformity of the fluorescence was excellent.

Comparative Example

Electron-emitting devices similar to the ones of Example 3 were prepared and evaluated in the same manner as in Example 3 except that the flat gold crystal electrode was replaced by a gold electrode prepared by a known vacuum deposition. The resulting devices had a variance angle of 2° or more at the plane orientation of (111). The electron emission pattern was observed to coincide with the shape of surface electrode by use of a fluorescent screen. The uniformity of the fluorescence was relatively good. However, the luminance was observed to be slightly irregular. The emission efficiency was not more than $1 \times 10^{-3}$ at the highest.

Example 4

Experiments were conducted in the same manner as in Example 2 and 3 by using the same solution as described in Example 1 and by changing the kind of the substrate. Consequently, the memory-switching characteristics were similar to that in Example 2, and the ON/OFF resistance ratio obtained was in the order of about 6 ciphers. The transition between the ON state and the OFF state was caused repeatedly for a long time by application of alternate voltage. Consequently, the ON/OFF transition of this device was stabilized in comparison with devices of the prior art. In particular, the switching characteristics was stable even with the device having an LB film of four or eight layers, which is instable according to prior art. The switching characteristics was observed even with the device having two layers, which did not exhibit switching characteristics in devices of prior art. Further, device damage, which is considered to be caused by local concentration of the electric field, occurred to a much lesser degree, and the life of the device was significantly improved.

The resulting devices were tested for electron emission in the same manner as in Example 3. Consequently, electron emission observed was similar to that in Example 3. The electron emission efficiency was about $1.5 \times 10^{-2}$ at the highest. Higher voltage was required to obtain the same emission current with larger number of built-up layers of the insulator layer. The electron emission pattern was observed by use of a fluorescent screen placed directly above the device. The fluorescence pattern coincided with the shape of the surface electrode, and the uniformity of the fluorescence was excellent.

The surface properties of the electrode layer employed in Examples are summarized in Table 1.

TABLE 1

| kind of substrate | Variance angle | Surface roughness (in a region surrounded by a square with 10 μm length) | |
|---|---|---|---|
| | | Maximum roughness | Dispersion peak |
| Si 1) | 0.9° | 0.8 nm | 0.4 nm |
| HOPG | 0.6° | 0.7 nm | 0.3 nm |
| Au/Si | 0.9° | 0.8 nm | 0.4 nm |
| Cr/Si | 0.9° | 0.8 nm | 0.4 nm |
| Al/Si | 0.9° | 0.9 nm | 0.4 nm |
| a-Si/SiO$_2$ 2) | 0.9° | 0.9 nm | 0.4 nm |
| Glass | 1.0° | 1.0 nm | 0.4 nm |
| SiO$_2$/Si 3) | 0.9° | 0.8 nm | 0.4 nm |
| SiN/Si | 1.0° | 0.9 nm | 0.4 nm |
| MgO | 0.6° | 1.0 nm | 0.4 nm |
| Polyimide 4) | 1.0° | 1.1 nm | 0.4 nm |

Note
1) Treated by etching
2) Thermal oxidation film
3) Thermal oxidation film
4) Capton Example 5

Figure 7:
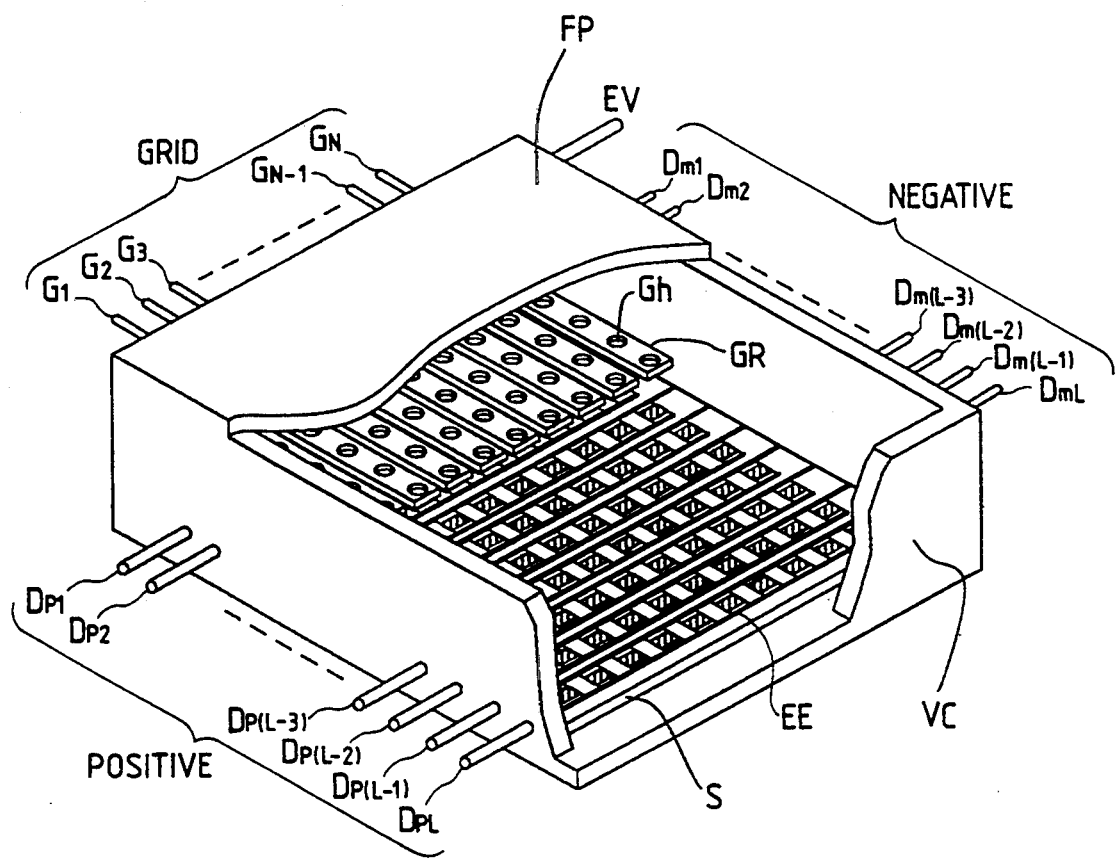
FIG. 7 shows a perspective view of construction of an image-displaying apparatus of the present invention.

An image displaying apparatus was constructed as shown in FIG. 7 by use of devices prepared as in Example 3.

One hundred electron-emitting devices (EE) were arranged to form an device line. 100 lines were placed in parallel on a glass substrate (S). In FIG. 7, N is the number of the devices in a line, 100, and L is the number of device lines, 100. Modulation grid 10 electrodes (GR) were placed with insulating support at a distance of 10 μm from the electron-emitting face of the device. 100 grid electrodes were placed in a direction orthogonal to the device lines, and an electron-passing holes (Gh) in the size of 0.4 mm×0.4 mm for respective devices. Further above the grid electrodes, there were placed a face plate (FP) of 4 mm thick constituted of three layers of a fluorescent substance layer, a transparent electrode layer, and a glass plate at a distance of 5 mm from the electron-emitting face of the device. Thereby a vacuum container (VC) (about $2 \times 10^{-6}$ Torr) was formed as a whole.

With this apparatus, on application of voltage of 8 V between the device electrodes, a fluorescence pattern was obtained on the fluorescence face in correspondence to respective devices with high luminance without irregularity. Naturally the displayed image could be controlled by XY matrix drive of the grid electrodes and device lines. The procedure of preparing the gold electrode used in the above apparatus is described below.

Figure 8:
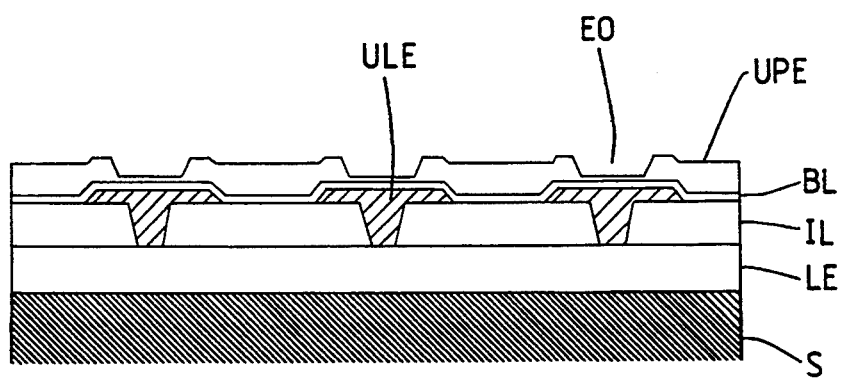
FIG. 8 shows a schematic cross-sectional view of an array of electron emitting devices employed in the image-displaying apparatus of FIG. 7.

Gold was vapor-deposited in lines (LE) in a thickness of 1000 Å on a substrate (S). Thereon SiO$_2$ was vapor-deposited as an insulating layer (IL) in a thickness of 1500 Å to cover the entire face. Then, holes of 1 μm square were formed at the intersecting points of the matrix as shown in FIG. 7 by a known method. The substrate was immersed in the mother liquor used in Example 1, and plate-shaped gold crystals were formed as underlying electrodes (ULE) at the positions of the intersecting points of the matrix. Polyimide LB film (BL) was formed on the electrode substrate. Then aluminum upper electrodes (UPE) were formed thereon in the same manner as in Example 3 (FIG. 8), thus obtaining an electron-emitting element array having electron-emittion openings (EO).

Example 6

Figure 9:
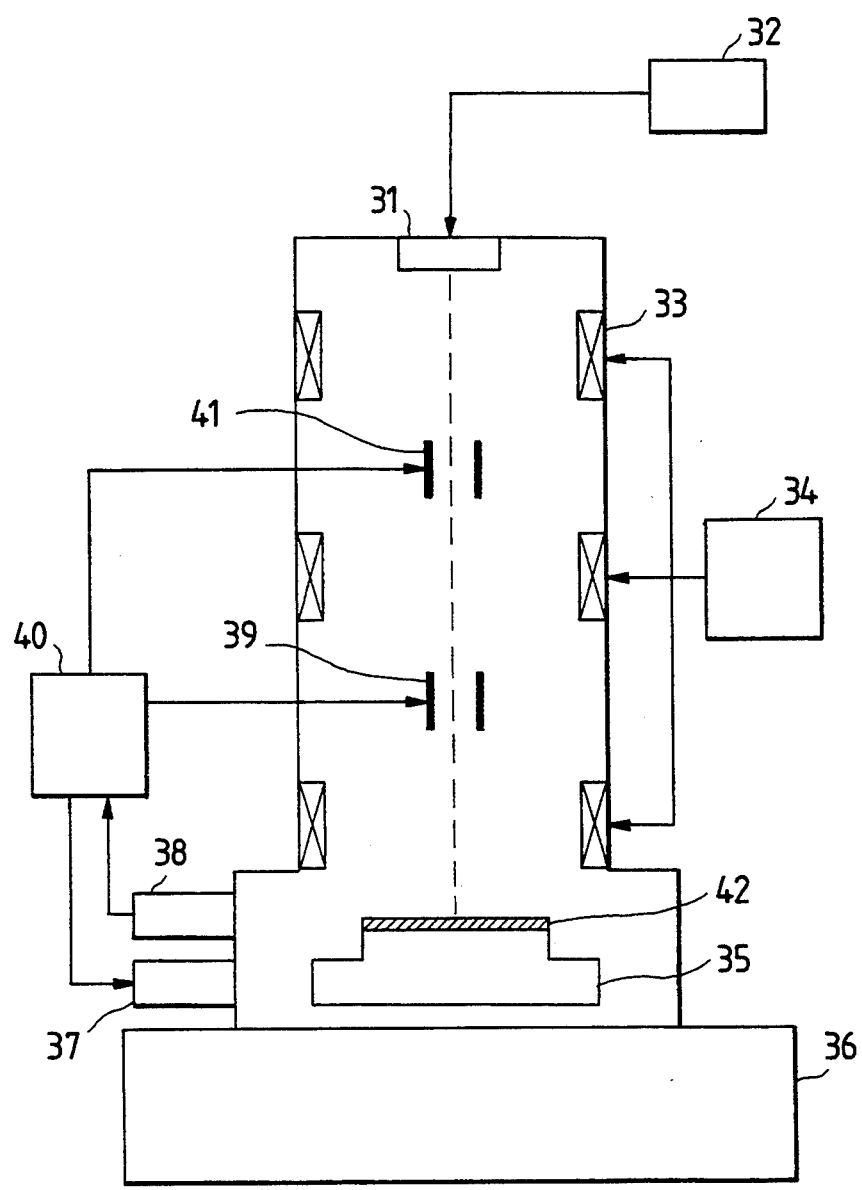
FIG. 9 shows schematically an image-drawing apparatus employing an electron-emitting device of the present invention.

An image-drawing apparatus shown in FIG. 9 was constructed on a support table 36 by use of one device as shown in FIG. 5B obtained in Example 3. The distance from the surface of the electron-emitting device 31 to the wafer 42 on the stage 35 was about 400 mm, and a vacuum chamber ($2 \times 10^{-7}$ Torr) encases the electron-emitting device and the stage. Therein were provided blanking electrodes 41, deflection electrodes 39, and three stages of electromagnetic lenses 33.

Further, as shown in the drawing, there were provided an electron source driving device 32, an electromagnetic lens driving device 34, adjusting mechanisms 37 and 38 for adjusting the stage 35, a control mechanism 40, and so forth.

With this apparatus, an image pattern could be drawn on a wafer 42 with high precision by applying voltage of about 8 V to the device and moving the stage.

Example 7

Figure 10:
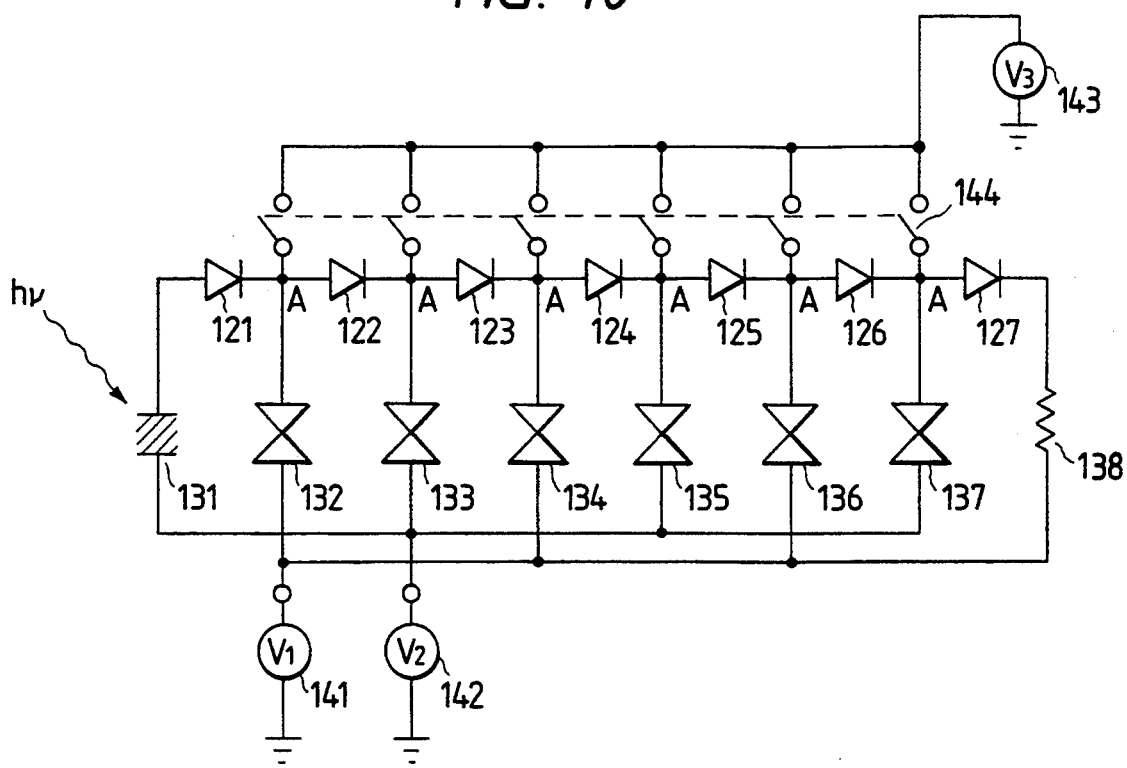
FIG. 10 shows constitution of an information-transferring apparatus employing an electric device (a switching device) of the present invention.

FIG. 10 illustrates the circuit of this Example. In this Example, diode devices 121–127 are connected from top to end in series in the same rectification direction. The aforementioned switching LB-MIM devices 132–137 are placed respectively at the connection points A's of the diode devices. A photoconductive device is placed at the top of the circuit, and a resistor 138 is placed at the end of the circuit.

This circuit B enables transfer of information on the light and dark states, which are detected by the photoconductive device 131, sequentially in the diode rectification direction, and enables memorization of the information, and simultaneously enables readout of the transferred and memorized information by monitoring the voltage between the both ends of the resistor 138 at the circuit end.

Figure 12:
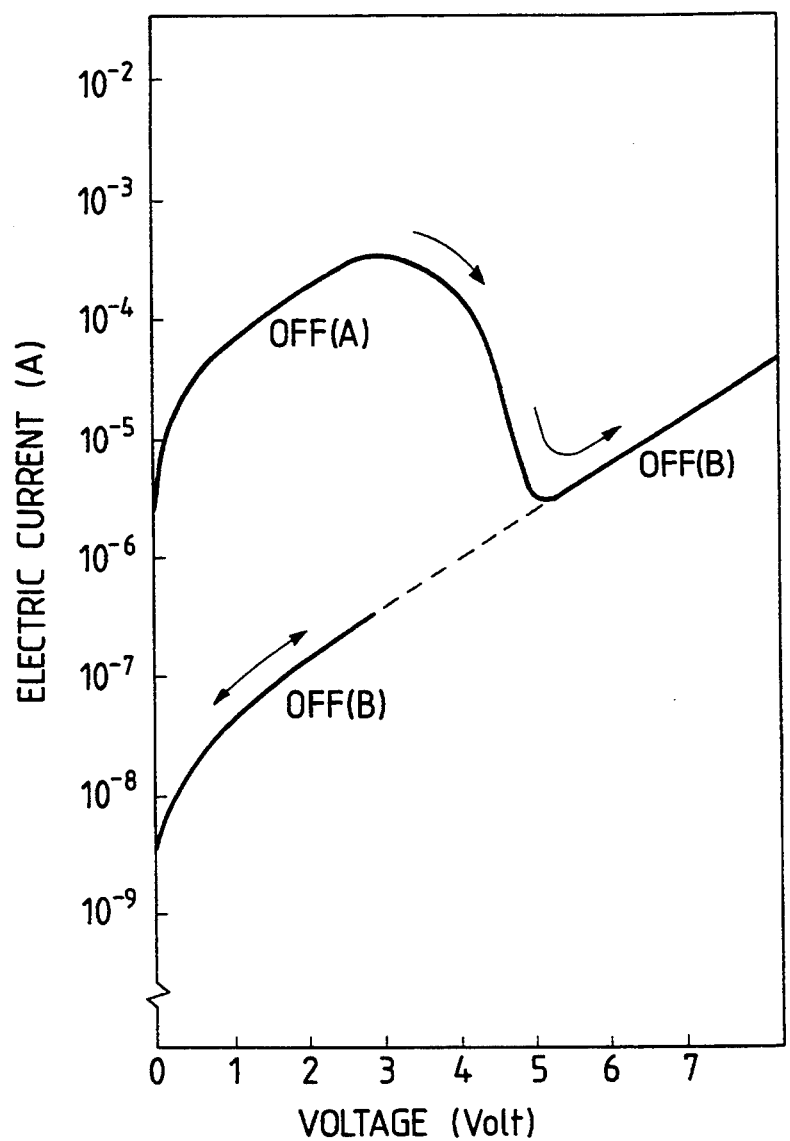
FIG. 12 shows in more detail a current-voltage characteristic of an electric device (a switching device) of the present invention in the OFF state.

The OFF state (shown by FIG. 6) of the aforementioned LB-MIM switching device was investigated in more detail. Consequently, the existence of two states were confirmed which exhibit different electroconductive characteristics. The current-voltage characteristics are shown in FIG. 12. The information-transferring apparatus of the present invention utilizes the characteristics of the LB-MIM switching device shown in FIG. 12. It is described below in detail.

In FIG. 10, the numerals 141 and 142 indicate voltage applying means $V_1$ and $V_2$ for information transfer, the numeral 143 indicates a voltage-applying means $V_3$ for bringing any of the devices 132–137, to which the information is transferred, to the OFF (B) state (state "0" in FIG. 12), and the numeral 144 is a relay switch to bring the voltage applying means 143 to a disconnected state to the connection point A on information transfer.

Figure 11:
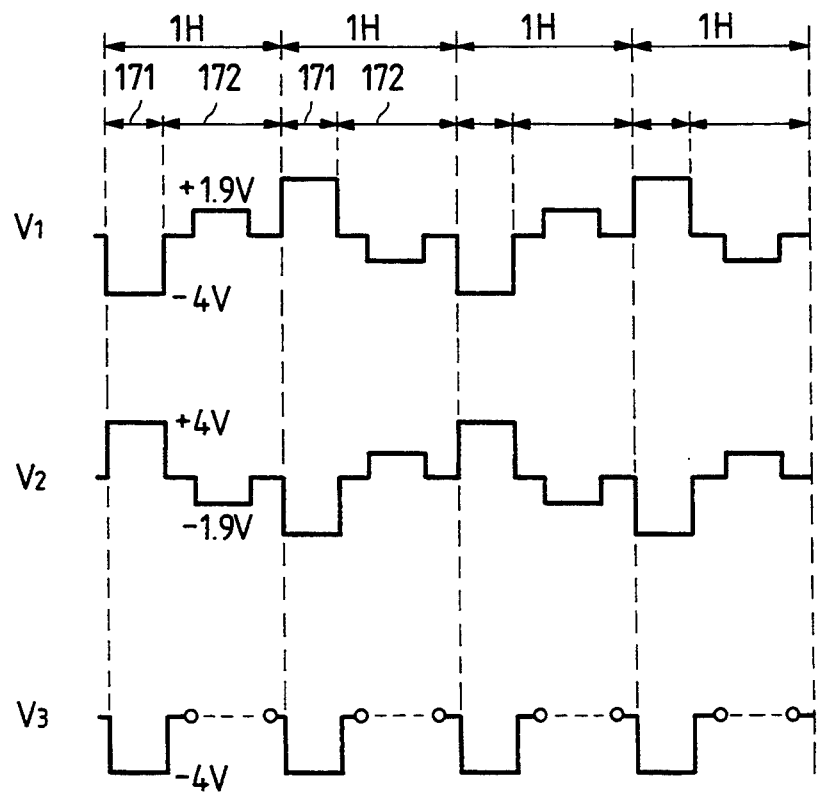
FIG. 11 illustrates the application of the voltages $V_1$, $V_2$, and $V_3$ in Example 7.

In such an apparatus, information transfer and recording are conducted by employing the power sources $V_1$, $V_2$, and $V_3$ by applying voltages in repetition as shown in FIG. 11, for example, such that one cycle of the voltage application include a first period 171 and a second period 172, and the polarity of the voltage is different between $V_1$ and $V_2$, and the absolute values of the voltage of $V_1$, $V_2$, and $V_3$ are equal at the first period.

In this Example particularly, the resistance in a dark state of the photoconductive device 131, the resistance of the LB-MIM switching devices 121–127 in the OFF state (B), and the resistance of the resistor 138 at the circuit end are equal in MΩ order, and the diodes 121–127 are silicon diodes exhibiting a holding voltage $V_F$ of 0.7 V in the normal direction and a reverse-direction resistance of sufficiently higher than MΩ.

If the peak voltage in the first period is ±4 V and the switch 144 is closed, then the voltage $V_1-V_2=+8$ V is applied to every other diode of the diodes 121–127, no voltage being applied to the other devices. The LB-MIM switching devices to which the voltage of +8 V has been applied are reset to come to be in the OFF state (B) and are ready to receive information, while the devices to which the voltage has not been applied keep holding information to serve the information source.

Subsequently, in the second period, the peak voltages of $V_1$ and $V_2$ are changed to ±1.9 V, and the $V_3$ is disconnected by turning off the relay switch 144. Thereby, highly independent circuits are formed by the information-sending LB-MIM device (or the photoconductive device), the diode in normal direction, and the information-receiving LB-MIM device (or the resistor at the end). Consequently, the voltage of 3.1 V after subtracting the holding voltage of the diode $V_F(=0.7$ V), namely $3.8-0.7$ V, is applied to series circuit of the LB-MIM devices, thus information is transferred and recorded (excluding the end resistor). Therefore, the optical information detected by the photoconductive device 131 at the top portion is transferred to and recorded in the subsequent devices, or can be read out by resistance coupling at the end by repeated application of the voltage in the above wave form. The time of cycle (1H) consisting the first period and the second period was 3 seconds in this Example.

As described above, the MIM type electric device and the process for producing the device of the present invention have advantages as described below.

(1) Flat electrode is formed which has high crystallinity and uniform crystal plane, and surface roughness of at most 1 nm in a region surrounded by a square with sides of 1 μm length, or 10 μm length.

(2) Consequently the memory-switching characteristics, which were disclosed by the inventor of the present invention in a MIM type device having a sandwich structure comprising an insulator layer constructed of an organic thin film of periodical structure, is realized more stably with thinner organic insulator layer. The ratio of the resistances between the two memory states, namely the ON/OFF resistance ratio is larger than that of prior art. Further, even when the ON/OFF transition is conducted continuously for a long time, the breakdown of the device, which is considered to be caused by local concentration of the electric field, is less liable to occur, thereby the life of the device being elongated. In other words, the device of a sandwich structure is improved in stability of characteristics under application of strong electric field.

(3) The form of emission of the electron beam is improved. The intensity of the fluorescence is made uniform, and the electron-emitting efficiency is improved.

(4) An image-displaying apparatus or an image-drawing apparatus with the above electron-emitting device, gives images of high luminance without irregularity of the luminance and with high resolution, or a drawn image with high resolution.

(5) The process of producing the device of the present invention enables-formation of flat plate-shaped gold crystals on a desired site of a substrate by utilizing the effects of Minds and shape of the substrate material on the crystal depositing characteristics of gold.

(6) An information-transferring apparatus which is capable of storing optical information semipermanently even after power source voltage is turned off is realized by transferring the information to a memory-switching device of sandwich structure and recording it therein.

What is claimed is:

1. An MIN type electric device having an upper electrode, a lower electrode, and a barrier layer held therebetween and composed of an insulator or a semiconductor, the lower electrode containing a noble metal crystal in the shape of a plate formed on a substrate, and having a surface constituted of a crystal face (111) of the noble metal crystal, said crystal face (111) exhibiting a variance angle of not more than 1° by X-ray diffraction.

2. An MIM type electric device according to claim 1, wherein the noble metal crystal is monocrystalline.

3. An MIM type electric device according to claim 1, wherein the noble metal crystal is polycrystalline.

4. An MIM type electric device according to claim 1, wherein the crystal face (111) has a surface roughness as height difference of not more than 1 nm in a region of 1 μm square.

5. An MIM type electric device according to claim 1, wherein the barrier layer is an organic thin film having a periodical layer structure.

6. An MIM type electric device according to claim 1, wherein the barrier layer is an organic thin film composed of a monomolecular or monomolecular built-up film.

7. An MIM type electric device according to claim 1, wherein a second insulating layer is provided between the barrier layer and the upper electrode to form a hollow in the upper electrode.

8. An MIM type electric device according to claim 1, wherein the noble metal is gold.

9. An information-transferring apparatus, comprising a circuit having a MIM type electric device of any one of claims 1 to 8 and a photoconductive device connected in series to the electric device, and a means for applying voltage to the circuit.

10. An information-transferring apparatus, comprising a circuit formed from diode devices connected in series in the same rectification direction, a MIM type electric device of any one of claims 1 to 8 connected to a connection point of the diode elements, a photoconductive device placed at one end of the circuit, and a resistor at the other end of the circuit; and a means for applying voltage to the circuit.

11. An image-displaying apparatus, comprising a plurality of MIM type electric devices having a portion to emit an electron beam, modulation electrodes opposing thereto, and an image-forming member; the MIM type electric devices having an upper electrode, a lower electrode, and a barrier layer held therebetween and composed of an insulator or a semiconductor, the lower electrode containing a noble metal crystal in the shape of a plate formed on a substrate, and having a surface constituted of a crystal face (111) of the noble metal crystal, said crystal face (111) exhibiting a variance angle of not more than 1° by X-ray diffraction; the modulation electrodes modulating electron beams emitted from the electric devices; and the image-forming member forming an image by projection of the modulated electron beams.

12. An image-drawing apparatus, comprising an MIM type electric device having a portion to emit an electron beam, a means for focusing the electron beam emitted from-the electric device to a desired position, and a means for deflecting the electron beam; the MIM type electric device having an upper electrode, a lower electrode, and a barrier layer held therebetween and composed of an insulator or a semiconductor, the lower electrode containing a noble metal crystal in the shape of a plate formed on a substrate, and having a surface constituted of a crystal face, of the noble metal (111), said crystal face (111) exhibiting a variance angle of not more than 1° by X-ray diffraction.

13. An image-displaying apparatus according to claim 11, wherein the noble metal crystal is monocrystalline.

14. An image-displaying apparatus according to claim 11, wherein the noble metal crystal is polycrystalline.

15. An image-displaying apparatus according to claim 11, wherein the crystal face (111) has a surface roughness as height difference of not more than 1 nm in a region of 1 $\mu$m square.

16. An image-displaying apparatus according to claim 11, wherein the barrier layer is an organic thin film having a periodical layer structure.

17. An image-displaying apparatus according to claim 11, wherein the barrier layer is an organic thin film composed of a monomolecular or monomolecular built-up film.

18. An image-displaying apparatus according to claim 11, wherein a second insulating layer is provided between the barrier layer and the upper electrode to form a hollow in the upper electrode.

19. An image-displaying apparatus according to claim 11, wherein the noble metal is gold.

20. An image-drawing apparatus according to claim 12, wherein the nobel metal crystal is monocrystalline.

21. An image-drawing apparatus according to claim 12, wherein the noble metal crystal is polycrystalline.

22. An image-drawing apparatus according to claim 12, wherein the crystal face (111) has a surface roughness as height difference of not more than 1 nm is a region of 1 $\mu$m square.

23. An image-drawing apparatus according to claim 12, wherein the barrier layer is an organic thin film having a periodical layer structure.

24. An image-drawing apparatus according to claim 12, wherein the barrier layer is an organic thin film composed of a monomolecular or monomolecular built-up film.

25. An image-drawing according to claim 12 wherein a second insulating layer is provided between the barrier layer and the upper electrode to form a hollow in the upper electrode.

26. An image-drawing apparatus according to claim 12, wherein the nobel metal is gold.

* * * * *

UNITED STATES PATENT AND TRADEMARK OFFICE
CERTIFICATE OF CORRECTION

PATENT NO. : 5,432,379
DATED : July 11, 1995
INVENTOR(S) : KEN EGUCHI, ET AL.

It is certified that error appears in the above-indentified patent and that said Letters Patent is hereby corrected as shown below:

On the Title page, item [54] and column 1, line 2, "DEVICE" should read --DEVICE,--.

COLUMN 1

Line 39, "a" should be deleted;

Line 50, "in" should be deleted;

Line 59, "insulation." should read --insulation--; and

Line 65, "does" should read --do--.

COLUMN 2

Line 32, "A still" should read --Still--.

COLUMN 5

Line 14, "topograplic" should read --topographic--;

Line 40, "metal," should read --metals,--; and "compound." should read --compounds.--; and Line 42, "the" (second occurrence) should be deleted.

COLUMN 9

Line 4, "was" should read --were--.

UNITED STATES PATENT AND TRADEMARK OFFICE
CERTIFICATE OF CORRECTION

PATENT NO. : 5,432,379
DATED : July 11, 1995
INVENTOR(S) : KEN EGUCHI, ET AL.

It is certified that error appears in the above-indentified patent and that said Letters Patent is hereby corrected as shown below.

COLUMN 10

Line 60, "ON" should read --ON--.

COLUMN 11

Line 47, "an" should read --a--; and

Line 54, "an" should be deleted.

COLUMN 14

Line 19, "minds" should read --kinds--; and

Line 29, "MIN" should read --MIM--.

COLUMN 15

Line 23, "from-the" should read --from the--.

COLUMN 16

Line 19, "nobel" should read --noble--;

Line 24, "is" should read --in--;

Line 33, "claim 12" should read --claim 12,-- and "image-drawing" should read --image-drawing apparatus--; and

UNITED STATES PATENT AND TRADEMARK OFFICE
CERTIFICATE OF CORRECTION

PATENT NO. : 5,432,379
DATED : July 11, 1995
INVENTOR(S) : KEN EGUCHI, ET AL.

It is certified that error appears in the above-indentified patent and that said Letters Patent is hereby corrected as shown below:

<u>COLUMN 16, Cont'd.</u>

Line 38, "nobel" should read --noble--.

Signed and Sealed this

Twenty-first Day of November, 1995

Attest:

BRUCE LEHMAN

Attesting Officer      Commissioner of Patents and Trademarks